United States Patent
Kiuchi et al.

(10) Patent No.: US 6,488,803 B2
(45) Date of Patent: Dec. 3, 2002

(54) RADIATION-CURABLE HEAT-PEELABLE PRESSURE-SENSITIVE ADHESIVE SHEET AND PROCESS FOR PRODUCING CUT PIECES WITH THE SAME

(75) Inventors: Kazuyuki Kiuchi, Osaka (JP); Toshiyuki Oshima, Osaka (JP); Akihisa Murata, Osaka (JP); Yukio Arimitsu, Osaka (JP)

(73) Assignee: Nitto Denko Corporation, Osaka (JP)

( * ) Notice: Subject to any disclaimer, the term of this patent is extended or adjusted under 35 U.S.C. 154(b) by 5 days.

(21) Appl. No.: 09/782,037

(22) Filed: Feb. 14, 2001

(65) Prior Publication Data

US 2001/0019765 A1 Sep. 6, 2001

(30) Foreign Application Priority Data

Feb. 16, 2000 (JP) ........................................ 2000-038899

(51) Int. Cl.⁷ .......................... B32B 7/12; B44C 1/165; C09J 7/02
(52) U.S. Cl. ........................ 156/230; 428/345; 428/352; 428/354; 428/355 R; 156/283; 156/334
(58) Field of Search ................... 428/343, 345, 428/352, 354, 355 R; 156/230, 283, 334

(56) References Cited

FOREIGN PATENT DOCUMENTS

| | | | |
|---|---|---|---|
| EP | 0 612 823 A1 | 8/1994 | |
| EP | 1 033 393 A2 | 9/2000 | |
| JP | 6317981 | * | 1/1988 |

OTHER PUBLICATIONS

XP-002177203—Patent Abstract (Jan. 25, 1988).
European Search Report dated Sep. 24, 2001.

* cited by examiner

*Primary Examiner*—Daniel Zirker
*Assistant Examiner*—Victor S Chang
(74) *Attorney, Agent, or Firm*—Sughrue Mion, PLLC

(57) ABSTRACT

A radiation-curable heat-peelable pressure-sensitive adhesive sheet is disclosed which has tackiness enabling adherends to withstand transportation and other steps, with which cutting can be conducted without flinging up an adhesive waste or causing chipping, and from which the cut pieces can be easily separated and recovered. The radiation-curable heat-peelable pressure-sensitive adhesive sheet comprises a substrate and, formed on at least one side thereof, a pressure-sensitive adhesive layer containing heat-expandable microspheres and a radiation-curable compound. A work to be cut is placed on the surface of the pressure-sensitive adhesive layer of the radiation-curable heat-peelable pressure-sensitive adhesive sheet, and the pressure-sensitive adhesive layer is irradiated with a radiation to cure the adhesive layer. The work is cut into pieces and the pressure-sensitive adhesive layer is then thermally foamed, before the cut pieces are separated and recovered from the adhesive sheet. Thus, cut pieces can be efficiently produced without arousing troubles in processing steps.

6 Claims, 1 Drawing Sheet

RADIATION-CURABLE HEAT-PEELABLE PRESSURE-SENSITIVE ADHESIVE SHEET AND PROCESS FOR PRODUCING CUT PIECES WITH THE SAME

FIELD OF THE INVENTION

The present invention relates to a radiation-curable heat-peelable pressure-sensitive adhesive sheet from which cut pieces of an adherend can be easily separated and recovered through irradiation with a radiation and a heat treatment. The invention further relates to a process for producing cut pieces with the adhesive sheet.

DESCRIPTION OF THE RELATED ART

A heat-peelable pressure-sensitive adhesive sheet comprising a high modulus film or sheet substrate made of a plastic or the like and formed thereon a pressure-sensitive adhesive layer containing a blowing agent has been known as a pressure-sensitive adhesive sheet which is used in cutting a work to be cut, such as a semiconductor wafer or a multilayer capacitor sheet, into pieces of a given size in such a manner that the adhesive sheet is applied to the work (adherend) and the cut pieces, e.g., chips, are easily separated and recovered therefrom (see, for example, JP-B-50-13878 (the term "JP-B" as used herein means an "examined Japanese patent publication"), JP-B-51-24534, JP-A-56-61468 (the term "JP-A" as used herein means an "unexamined published Japanese patent application"), JP-A-56-61469, and JP-A-60-252681). This heat-peelable pressure-sensitive adhesive sheet is intended to attain both the adhesive holding power which enables the adhesive sheet to withstand adherend cutting and the easy separation and recovery of resultant cut pieces therefrom. Namely, this pressure-sensitive adhesive sheet has the following feature. The adhesive sheet has high tackiness when in contact with an adherend. However, at the time when cut pieces are to be recovered, the foamable pressure-sensitive adhesive layer containing heat-expandable microspheres is foamed or expanded by heating to thereby come to have a roughened surface. Due to the resultant decrease in the area in which the adhesive layer is adherent to the adherend, the tackiness is reduced or lost and, hence, the cut pieces can be easily separated from the adhesive sheet.

However, the heat-peelable pressure-sensitive adhesive sheet described above has the following problems when used in cutting an adherend fixed thereto. Since the pressure-sensitive adhesive layer is soft and is thick because it contains heat-expandable microspheres, an adhesive waste is flung up by the cutting blade and the pressure-sensitive adhesive layer deforms to cause chipping. An effective measure in overcoming these problems is to reduce the thickness of the pressure-sensitive adhesive layer. However, if the heat-peelable pressure-sensitive adhesive sheet described above is produced so that the pressure-sensitive adhesive layer has a reduced thickness not larger than the size of the heat-expandable microspheres, then the heat-expandable microspheres partly protrude from the surface of the pressure-sensitive adhesive layer to impair the surface smoothness of the pressure-sensitive adhesive layer. This pressure-sensitive adhesive, sheet cannot have tackiness sufficient to hold an adherend thereon. Consequently, thickness reduction in the pressure-sensitive adhesive layer is limited and there are cases where those problems remain unsolved.

On the other hand, a radiation-curable pressure-sensitive adhesive sheet also is extensively used in cutting a work into pieces in such a manner that the adhesive sheet is applied to the work and the cut pieces, e.g., chips, are separated and recovered therefrom. The radiation-curable pressure-sensitive adhesive sheet generally has a pressure-sensitive adhesive layer containing a radiation-curable compound, and is characterized in that when the cut pieces resulting from the cutting are to be recovered, the radiation-curable pressure-sensitive adhesive sheet is irradiated with a radiation to cure the pressure-sensitive adhesive layer and thereby considerably reduce the tackiness thereof. In this radiation-curable pressure-sensitive adhesive sheet, the thickness of the pressure-sensitive adhesive layer can be reduced infinitesimally and this is advantageous in preventing the adhesive from being flung up or deformed. However, use of the conventional radiation-curable pressure-sensitive adhesive sheet has the following problem. Since the pressure-sensitive adhesive layer, even after having been cured by irradiation with a radiation, generally has residual tackiness, the recovery of cut pieces necessitates a pickup operation in which a physical stress is necessary for, e.g., pushing up the cut pieces. It has been pointed out that this pickup recovery operation may mar or crack the cut pieces when the cut pieces are exceedingly thin like semiconductor wafers and the like, whose thickness is decreasing recently.

In JP-B-63-17981 is disclosed a pressure-sensitive adhesive sheet for use in cutting a semiconductor wafer into pieces. This pressure-sensitive adhesive sheet comprises a substrate coated with a pressure-sensitive adhesive layer comprising a pressure-sensitive adhesive, a radiation-polymerizable compound, and a heat-expandable compound. In the patent document cited above is also disclosed a method which comprises adhering a semiconductor wafer to the surface of the pressure-sensitive adhesive layer of the pressure-sensitive adhesive sheet, dicing the wafer, subsequently conducting irradiation with a radiation and a thermal expansion treatment simultaneously to reduce the tackiness, and then picking up the cut pieces. This method, however, has the following drawback. Since the irradiation with a radiation and thermal expansion treatment for reducing tackiness are simultaneously conducted after the cutting (dicing) step, an adhesive waste is flung up and the adhesive layer deforms during the work-cutting operation. As a result, the precision of cutting is low. In addition, since the pressure-sensitive adhesive layer has high residual tackiness after the irradiation with a radiation and thermal expansion treatment, it is difficult to recover exceedingly thin cut pieces.

SUMMARY OF THE INVENTION

One object of the, invention is to provide a radiation-curable heat-peelable pressure-sensitive adhesive sheet which has tackiness enabling adherends to withstand transportation and other steps, with which cutting can be conducted without flinging up an adhesive waste or causing chipping, and from which the cut pieces can be easily separated and recovered.

Another object of the invention is to provide a process for producing cut pieces with the pressure-sensitive adhesive sheet.

As a result of intensive studies to accomplish those objects, it has been found the following.

A pressure-sensitive adhesive sheet comprising a substrate and formed on a surface thereof a pressure-sensitive adhesive layer having both radiation curability and thermal expansibility can be used to cut a work and efficiently and smoothly separate and recover the cut pieces therefrom without arousing troubles in processing steps, when the thermal expansibility is imparted with heat-expandable microspheres and the work-cutting step is conducted after the curing of the pressure-sensitive adhesive layer by irradiation with a radiation and before the thermal foaming of the pressure-sensitive adhesive layer. The invention has been completed based on this finding.

The invention provides a radiation-curable heat-peelable pressure-sensitive adhesive sheet which comprises a substrate and, formed on at least one side thereof, a pressure-sensitive adhesive layer containing heat-expandable microspheres and a radiation-curable compound.

The invention further provides a process for producing cut pieces which comprises placing a work to be cut on the surface of the pressure-sensitive adhesive layer of the radiation-curable heat-peelable pressure-sensitive adhesive sheet described above, irradiating the pressure-sensitive adhesive layer with a radiation to cure the adhesive layer, cutting the work into pieces, subsequently thermally foaming the pressure-sensitive adhesive layer, and then separating and recovering the cut pieces from the adhesive sheet.

DESCRIPTION OF THE REFERENCE NUMERALS AND SIGNS

1: Substrate

2: Radiation-curable heat-expandable pressure-sensitive adhesive layer

2a: Pressure-sensitive adhesive layer which has cured through irradiation with radiation 2b: Pressure-sensitive adhesive layer which has been thermally expanded after irradiation with radiation 3: Separator 4: Pressure-sensitive adhesive layer 5: Adherend (work to be cut)

6: Radiation

7: Cutting line

8: Cut piece

DETAILED DESCRIPTION OF THE INVENTION

Figure 1:
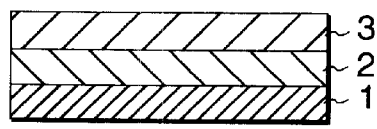
FIG. 1 is a diagrammatic sectional view showing one embodiment of the radiation-curable heat-peelable pressure-sensitive adhesive sheet of the invention.

Modes for carrying out the invention will be explained below in detail by reference to the drawings according to need. FIG. 1 is a diagrammatic sectional view showing one embodiment of the radiation-curable heat-peelable pressure-sensitive adhesive sheet of the invention. In this embodiment, a radiation-curable heat-expandable pressure-sensitive adhesive layer 2 has been formed on one side of a substrate 1 and a separator 3 has been further superposed thereon. The pressure-sensitive adhesive sheet according to the invention can have any appropriate shape selected from ordinary or known ones such as, e.g., sheet and tape forms.

The substrate 1, which serves as a support for the pressure-sensitive adhesive layer 2, etc., is made of a material having a degree of heat resistance such that the substrate is not impaired in mechanical strength by a heat treatment of the pressure-sensitive adhesive layer 2. Examples of the substrate 1 include films and sheets of plastics such as polyesters, olefin resins, and poly(vinyl chloride). However, the substrate 1 should not be construed as being limited to these examples. The substrate 1 is preferably cuttable by a cutting means, such as a cutter, used for cutting an adherend. Use of a substrate having heat resistance and stretchability, such as, e.g., a flexible polyolefin film or sheet, as the substrate 1 is advantageous in cut-piece recovery techniques in which cut pieces should be made apart from each other, because such a substrate can be stretched after the cutting of a work. In the case where ultraviolet is used as the radiation for curing the pressure-sensitive adhesive layer 2, the substrate 1 should be constituted of a material capable of transmitting ultraviolet at least in a given amount. The substrate 1 may have a single-layer or multilayer structure.

The thickness of the substrate 1 can be suitably selected in such a range as not to impair operating efficiency and working efficiency in the steps of application to an adherend, cutting of the adherend, separation and recovery of cut pieces, etc. However, the thickness thereof is generally 500 $\mu$m or smaller, preferably about 3 to 300 $\mu$m, more preferably about 5 to 250 $\mu$m. The surface of the substrate 1 may have undergone an ordinary surface treatment, e.g., a chemical or physical treatment such as treatment with chromic acid, exposure to ozone, exposure to flame, exposure to high-voltage electric shock, treatment with ionizing radiation, etc., a coating treatment with a primer (e.g., the pressure-sensitive adhesive substance which will be described later), or the like for the purpose of enhancing adhesion to the adjacent layer, holding power, etc.

The radiation-curable heat-expandable pressure-sensitive adhesive layer 2 comprises a pressure-sensitive adhesive substance for imparting tackiness, a radiation-polymerizable compound for imparting radiation curability, and heat-expandable microspheres for imparting thermal expansibility.

As the pressure-sensitive adhesive substance can be used conventionally known pressure-sensitive adhesives. Examples thereof include rubber-based pressure-sensitive adhesives comprising natural rubber or any of various synthetic rubbers, silicone-based pressure-sensitive adhesives, and acrylic pressure-sensitive adhesives comprising, e.g., a copolymer of an alkyl (meth)acrylate and one or more unsaturated monomers copolymerizable therewith. Such a pressure-sensitive adhesive may be one in which the base polymer has, in the molecule, carbon-carbon double bonds undergoing polymerization by the action of a radiation. Especially preferred among those pressure-sensitive adhesives are acrylic pressure-sensitive adhesives from the standpoint of compatibility thereof with the radiation-polymerizable compound to be incorporated into the pressure-sensitive adhesive layer 2 and other standpoints.

Examples of the acrylic pressure-sensitive adhesives include pressure-sensitive adhesives containing as the base polymer an acrylic polymer (homopolymer or copolymer) produced using one or more monomer ingredients selected from alkyl (meth)acrylates (such as the esters with $C_{1-20}$ alkyls, e.g., the methyl ester, ethyl ester, propyl ester, isopropyl ester, butyl ester, isobutyl ester, s-butyl ester, t-butyl ester, pentyl ester, hexyl ester, heptyl ester, octyl ester, 2-ethylhexyl ester, isooctyl ester, isodecyl ester, dodecyl ester, tridecyl ester, pentadecyl ester, hexadecyl ester, heptadecyl ester, octadecyl ester, nonadecyl ester, and eicosyl ester) and cycloalkyl (meth)acrylates (such as the esters with $C_{3-20}$ cycloalkyls, e.g., the cyclopentyl ester and cyclohexyl ester).

As an acrylic pressure-sensitive adhesive can also be used a pressure-sensitive adhesive containing as the base polymer a copolymer of one or more of those alkyl (or cycloalkyl) (meth)acrylates with one or more other monomers used for modifying pressure-sensitive adhesive properties or for other purposes. Examples of such other monomers (comonomers) include carboxyl-containing monomers such as acrylic acid, methacrylic acid, carboxyethyl acrylate, carboxypentyl acrylate, itaconic acid, maleic acid, fumaric acid, and crotonic acid; acid anhydride monomers such as maleic anhydride and itaconic anhydride; hydroxyl-containing monomers such as 2-hydroxyethyl (meth) acrylate, 2-hydroxypropyl (meth)acrylate, and 4-hydroxybutyl (meth)acrylate; sulfo-containing monomers such as styrenesulfonic acid, allylsulfonic acid, 2-(meth) acrylamido-2-methylpropanesulfonic acid, and (meth) acrylamidopropanesulfonic acid; phosphate-containing monomers such as 2-hydroxyethyl acryloylphosphate; (N-substituted) amide monomers such as (meth)acrylamide, N-butyl (meth)acrylamide, N-methylol (meth)acrylamide, and N-methylolpropane(meth)acrylamide; alkylaminoalkyl (meth)acrylate monomers such as aminoethyl (meth) acrylate and N,N-dimethylaminoethyl (meth)acrylate; alkoxyalkyl (meth)acrylate monomers such as methoxyethyl (meth)acrylate and ethoxyethyl (meth)acrylate; maleimide monomers such as N-cyclohexylmaleimide and N-isopropylmaleimide; itaconimide monomers such as N-methylitaconimide and N-ethylitaconimide; succinimide monomers such as N-(meth) acryloyloxymethylenesuccinimide and N-(meth)acryloyl-6-oxyhexamethylenesuccinimide; vinyl monomers such as vinyl acetate, vinyl propionate, N-vinylpyrrolidone, methylvinylpyrrolidone, styrene, and α-methylstyrene; cyanoacrylate monomers such as acrylonitrile and methacrylonitrile; epoxy-containing acrylic monomers such as glycidyl (meth)acrylate; acrylic glycol ester monomers such as polyethylene glycol (meth)acrylate and polypropylene glycol (meth)acrylate; acrylic ester monomers having one or more heterocycles, halogen atoms, silicon atoms, or the like, such as tetrahydrofurfuryl (meth)acrylate, fluoro(meth) acrylates, and silicone (meth)acrylates; polyfunctional monomers such as hexanediol di(meth)acrylate, (poly) ethylene glycol di(meth)acrylate, (poly)propylene glycol di(meth)acrylate, neopentyl glycol di(meth)acrylate, pentaerythritol di(meth)acrylate, trimethylolpropane tri(meth) acrylate, pentaerythritol tri(meth)acrylate, dipentaerythritol hexa(meth) acrylate, epoxy acrylates, polyester acrylates, and urethane acrylates; olefin monomers such as isoprene, butadiene, and isobutylene; and vinyl ether monomers such as vinyl ether. These monomers can be used alone or in combination of two or more thereof.

Appropriate additives may be incorporated into the radiation-curable heat-expandable pressure-sensitive adhesive layer 2 besides a pressure-sensitive adhesive, a radiation-polymerizable compound, and heat-expandable microspheres. Examples of such additives include crosslinking agents (e.g., isocyanate crosslinking agents and epoxy crosslinking agents), tackifiers (e.g., rosin derivative resins, polyterpene resins, petroleum resins, and oil-soluble phenolic resins), plasticizers, fillers, antioxidants, and surfactants. Furthermore, a photopolymerization initiator is incorporated when ultraviolet is used as a radiation.

The heat-expandable microspheres may be microspheres formed by surrounding a substance which readily becomes gaseous and expands upon heating, such as, e.g., isobutane, propane, or pentane, in elastic shells. The shells are usually made of a thermoplastic substance, a heat-meltable substance, a substance which bursts due to thermal expansion, or the like. Examples of such substances constituting the shells include vinylidene chloride/acrylonitrile copolymers, poly(vinyl alcohol), poly(vinyl butyral), poly (methyl methacrylate), polyacrylonitrile, poly(vinylidene chloride), polysulfones, and the like. The heat-expandable microspheres can be produced by an ordinary method such as, e.g., the coacervation method or the interfacial polymerization method. As the heat-expandable microspheres can also be used a commercial product such as Matsumoto Microsphere [trade name; manufactured by Matsumoto Yushi-Seiyaku Co., Ltd.].

The average particle diameter of the heat-expandable microspheres is generally about 1 to 80 μm, preferably about 1 to 50 μm, from the standpoints of dispersibility, suitability for thin-film formation, etc. Furthermore, in order for the heat-expandable microspheres to efficiently reduce the tackiness of the pressure-sensitive adhesive layer containing a pressure-sensitive adhesive through a heat treatment, the microspheres preferably have such a moderate strength that they do not burst until their degree of volume expansion reaches 5 times or more, especially exceeds 10 times (e.g., 12 times or more). In case of using heat-expandable microspheres which burst at a low degree of expansion or using a heat-expanding agent which has not been microencapsulated, the area in which the pressure-sensitive adhesive layer 2 is adherent to an adherend cannot be sufficiently reduced and satisfactory separability is difficult to obtain.

The amount of the heat-expandable microspheres to be used varies depending on the kind thereof. However, the amount thereof is generally 10 to 200 parts by weight, preferably about 20 to 125 parts by weight, per 100 parts by weight of the base polymer constituting the radiation-curable heat-expandable pressure-sensitive adhesive layer 2. If the amount of the microspheres is smaller than 10 parts by weight, the effect of reducing tackiness through a heat treatment is apt to be insufficient. On the other hand, if the amount thereof exceeds 200 parts by weight, the pressure-sensitive adhesive layer 2 is apt to suffer cohesive failure or interfacial separation from the substrate 1.

Into the radiation-curable heat-expandable pressure-sensitive adhesive layer 2 is incorporated a radiation-polymerizable compound which has at least two radiation-polymerizable carbon-carbon double bonds in the molecule and cures by the action of a radiation to have a three-dimensional network. A photopolymerization initiator is further incorporated when ultraviolet irradiation is used as a means for curing.

The radiation-polymerizable compound is preferably one having a molecular weight of about 10,000 or lower. More preferably, the radiation-polymerizable compound is one which has a molecular weight of about 5,000 or lower and contains from two or six radiation-polymerizable carbon-carbon double bonds per molecule so that the pressure-sensitive adhesive layer can be efficiently made to have a three-dimensional network through irradiation with a radiation. Typical examples of such a radiation-polymerizable compound include trimethylolpropane triacrylate, tetramethylolmethane tetraacrylate, pentaerythritol triacrylate, pentaerythritol tetraacrylate, dipentaerythritol monohydroxypentaacrylate, dipentaerythritol hexaacrylate, 1,4-butylene glycol diacrylate, 1,6-hexanediol diacrylate, and polyethylene glycol diacrylate. Such radiation-polymerizable compounds can be used alone or in combination of two or more thereof.

The amount of the radiation-polymerizable compound to be incorporated is determined in such a range as not to inhibit the heat-expandable microspheres from expanding or foaming after the pressure-sensitive adhesive layer 2 has been cured by irradiation with a radiation. The amount thereof is suitably determined according to the kind of the radiation-polymerizable compound, expansion pressure of the heat-expandable microspheres, desired adhesion of the cured pressure-sensitive adhesive layer to an adherend, conditions for a cutting operation, etc. However, the radiation-polymerizable compound is added in an amount of generally about from 1 to 100 parts by weight, preferably about from 5 to 60 parts by weight, per 100 parts by weight of the base polymer in the pressure-sensitive adhesive layer 2. When the pressure-sensitive adhesive layer 2 which has undergone irradiation with a radiation has dynamic moduli of elasticity of $5 \times 10^7$ Pa or lower and $1 \times 10^6$ Pa or higher respectively at the temperature at which the heat-expandable microspheres begin to expand and at the temperature at which a cutting operation is to be conducted, then it is possible to attain both excellent workability in cutting and excellent thermal peelability.

Examples of the photopolymerization initiator include isopropyl benzoin ether, isobutyl benzoin ether, benzophenone, Michler's ketone, chlorothioxanthone, dodecylthioxanthone, dimethylthioxanthone, acetophenone diethyl ketal, benzyl dimethyl ketal, α-hydroxycyclohexyl phenyl ketone, and 2-hydroxymethylphenylpropane. These photopolymerization initiators may be used alone or as a mixture of two or more thereof.

The amount of the photopolymerization initiation to be incorporated is generally preferably from 0.1 to 5 parts by weight per 100 parts by weight of the base polymer. Amounts thereof smaller than 0.1 part by weight are undesirable in that the pressure-sensitive adhesive layer 2 comes to have an insufficient three-dimensional network through ultraviolet irradiation and, hence, the resultant decrease in the adhesion of the pressure-sensitive adhesive sheet to cut pieces is too small. Conversely, amounts thereof exceeding 5 parts by weight are undesirable in that not only curing corresponding to such a large initiator amount cannot be obtained, but also this photopolymerization initiator partly remains adherent on the back side of cut pieces. An amine compound such as triethylamine, tetraethylpentamine, or dimethylaminoethanol may be used as a photopolymerization accelerator according to need in combination with the photopolymerization initiator.

The radiation-curable heat-expandable pressure-sensitive adhesive layer 2 can be formed by an ordinary method. For example, the adhesive layer can be formed by a method in which a coating fluid comprising a pressure-sensitive adhesive, heat-expandable microspheres, and a radiation-polymerizable compound and optionally containing a photopolymerization initiator, additives, a solvent, etc. is applied to a substrate 1. Alternatively, use may be made of a method in which the coating fluid is applied to an appropriate separator (e.g., release paper) to form a radiation-curable heat-expandable pressure-sensitive adhesive layer 2 and this layer is transferred to a substrate 1.

The thickness of the radiation-curable heat-expandable pressure-sensitive adhesive layer 2 is, for example, 300 μm or smaller (about 5 to 300 μm), preferably about 10 to 150 μm, from the standpoints of preventing the adhesive layer from leaving on the adherend an adhesive residue resulting from cohesive failure after the foaming or expansion of the heat-expandable microspheres, and of the particle diameter of the heat-expandable microspheres, etc.

As the separator 3 can, for example, be used a substrate comprising a plastic film, paper, or the like and having a surface coated with a release agent represented by a silicone resin, long-chain-alkyl acrylate resin, fluororesin, or the like or a substrate reduced in tackiness made of a nonpolar polymer such as polyethylene or polypropylene. The separator 3 may be used as a provisional support in transferring the radiation-curable heat-expandable pressure-sensitive adhesive layer 2 or the like to the substrate 1 as described above, or may be used as a protective material for protecting the radiation-curable heat-expandable pressure-sensitive adhesive layer 2 or the like until the adhesive sheet is subjected to practical use. The separator 3 need not be always disposed.

The radiation-curable heat-expandable pressure-sensitive adhesive layer 2 can be formed not only on one side of the substrate 1 but on each side thereof. It is also possible to form the radiation-curable heat-expandable pressure-sensitive adhesive layer 2 on one side of the substrate 1 and further form, on the other side thereof, an ordinary pressure-sensitive adhesive layer containing neither a radiation-polymerizable compound nor heat-expandable microspheres. Furthermore, an interlayer may be formed, for example, between the substrate 1 and the radiation-curable heat-expandable pressure-sensitive adhesive layer 2.

Figure 2:
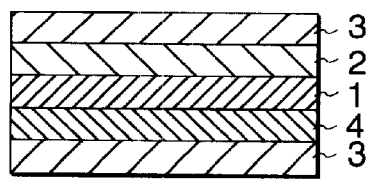
FIG. 2 is a diagrammatic sectional view showing another embodiment of the radiation-curable heat-peelable pressure-sensitive adhesive sheet of the invention.

FIG. 2 is a diagrammatic sectional view showing another embodiment of the radiation-curable heat-peelable pressure-sensitive adhesive sheet of the invention. In this embodiment, a radiation-curable heat-expandable pressure-sensitive adhesive layer 2 has been formed on one side of a substrate 1 and a separator 3 has been superposed thereon. Furthermore, a pressure-sensitive adhesive layer 4 and a separator 3 have been superposed on the other side of the substrate 1. This pressure-sensitive adhesive sheet differs from the pressure-sensitive adhesive sheet of FIG. 1 only in that the pressure-sensitive adhesive layer 4 and a separator 3 have been disposed on that side of the substrate 1 which is opposite to the side where the radiation-curable heat-expandable pressure-sensitive adhesive layer 2 has been formed.

The pressure-sensitive adhesive layer 4 comprises a pressure-sensitive adhesive substance. As this pressure-sensitive adhesive substance can be used the same pressure-sensitive adhesive substances (pressure-sensitive adhesives) as in the radiation-curable heat-expandable pressure-sensitive adhesive layer 2 described above. Appropriate additives may be incorporated into this pressure-sensitive adhesive layer 4 according to need. Examples of such additives include crosslinking agents (e.g., isocyanate crosslinking agents and epoxy crosslinking agents), tackifiers (e.g., rosin derivative resins, polyterpene resins, petroleum resins, and oil-soluble phenolic resins), plasticizers, fillers, antioxidants, and surfactants. However, in the case where ultraviolet is used as the radiation for curing the pressure-sensitive adhesive layer 2, it is undesirable to use or add a substance which considerably inhibits the polymerization initiation reaction of the photoreaction initiator to be incorporated in the pressure-sensitive adhesive layer 2.

The thickness of the pressure-sensitive adhesive layer 4 can be selected in such a range as not to impair operating efficiency and the like in application to an adherend, cutting of the adherend, separation and recovery of cut pieces, etc. In general, however, the thickness thereof is about 5 to 50

μm. The pressure-sensitive adhesive layer 4 can be formed by the same method as for the radiation-curable heat-expandable pressure-sensitive adhesive layer 2 described above. As each separator 3 can be used the same one as the separator 3 disposed on the radiation-curable heat-expandable pressure-sensitive adhesive layer 2. Such a pressure-sensitive adhesive sheet can be used in the state of being fixed to the surface of a pedestal by utilizing the pressure-sensitive adhesive layer 4.

Figure 3:
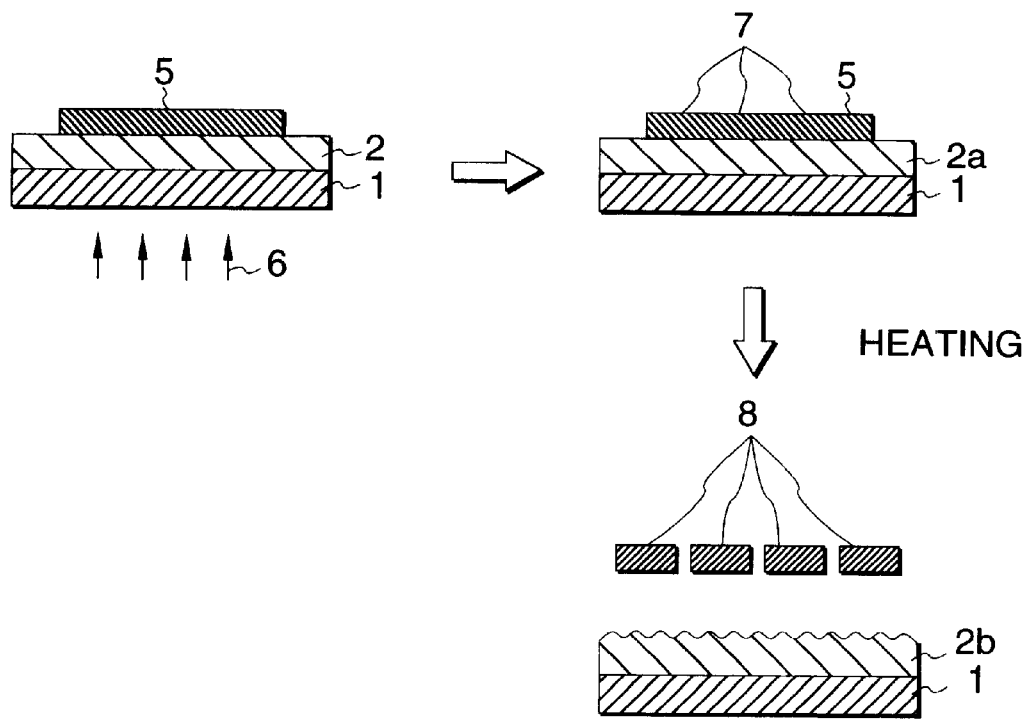
FIG. 3 is a diagrammatic view showing steps of one embodiment of the process of the invention for producing cut pieces.

FIG. 3 is a diagrammatic view showing steps of one embodiment of the process of the invention for producing cut pieces. More specifically, FIG. 3 illustrates, by means of sectional views, a series of steps comprising: press-bonding a work to be cut (adherend) 5 to the surface of the radiation-curable heat-expandable pressure-sensitive adhesive layer 2 of the radiation-curable heat-peelable pressure-sensitive adhesive sheet shown in FIG. 1 (from which the separator 3 has been removed); irradiating the radiation-curable heat-expandable pressure-sensitive adhesive layer 2 with a radiation 6 to cure the pressure-sensitive adhesive layer 2; cutting the adherend along cutting lines 7 into a given size to form cut pieces; subsequently conducting a heat treatment to expand or foam the heat-expandable microspheres contained in the pressure-sensitive adhesive layer; and then separating and recovering the cut pieces 8 from the sheet. In FIG. 3, numeral 1 denotes a substrate, 2a a pressure-sensitive adhesive layer which has cured through irradiation with a radiation, and 2b a pressure-sensitive adhesive layer which has been thermally expanded after the irradiation with a radiation.

The press-bonding of the adherend 5 to the radiation-curable heat-expandable pressure-sensitive adhesive layer 2 of the radiation-curable heat-peelable pressure-sensitive adhesive sheet can be accomplished, for example, using an appropriate pressing means such as a rubber roller, laminating roll, or pressing apparatus to press the adherend against the pressure-sensitive adhesive layer. Prior to this press-bonding, the pressure-sensitive adhesive substance may be activated if desired by heating at a temperature in a range where the heat-expandable microspheres do not expand or by applying water or an organic solvent, according to the type of the pressure-sensitive adhesive substance.

As the radiation can be used ultraviolet, electron beams, or the like. The irradiation with a radiation can be conducted by an appropriate method. However, when the pressure-sensitive adhesive layer is irradiated with ultraviolet, there are cases where the heat-expandable microspheres begin to expand due to the heat of irradiation. It is therefore desirable in ultraviolet irradiation to keep the pressure-sensitive adhesive layer at a temperature at which the heat-expandable microspheres do not begin to expand. This can be accomplished, for example, by minimizing the irradiation time or by air-cooling the radiation-curable heat-peelable pressure-sensitive adhesive sheet to which an adherend has been bonded.

The tackiness of the pressure-sensitive adhesive layer 2a which has cured through irradiation with a radiation can be suitably selected in such a range that the pressure-sensitive adhesive can be prevented from being flung up in the subsequent cutting operation and that the ability to fix the adherend 5 is not impaired. The tackiness thereof is generally about 0.1 to 10 N/20 mm, preferably about 0.3 to 2 N/20 mm (as measured by the same method as in the evaluation test which will be described later). The tackiness can be regulated by suitably selecting the kind and amount of the pressure-sensitive adhesive to be incorporated into the radiation-curable heat-expandable pressure-sensitive adhesive layer 2, kind and amount of the radiation-polymerizable compound, kind and amount of the photopolymerization initiator, irradiation dose, etc. This tackiness can be further reduced or lost by expanding the heat-expandable microspheres by a heat treatment after cutting operation.

The cutting of the adherend 5 can be conducted by an ordinary cutting means, e.g., dicing. Conditions for the heat treatment can be suitably fixed according to the surface state and heat resistance of the adherend 5 (or cut pieces 8), kind of the heat-expandable microspheres, heat resistance of the pressure-sensitive adhesive sheet, heat capacity of the adherend (cut pieces), etc. However, general conditions include a temperature of 350° C. or lower and a treatment time of 30 minutes or shorter, and especially preferably include a temperature of 100 to 200° C. and a treatment time of about from 1 second to 15 minutes. Usable techniques for heating include hot-air heating, contact with a hot plate, infrared heating, and the like. However, any heating technique may be used without particular limitations as long as it evenly foams or expands the cured pressure-sensitive adhesive layer 2a and neither fouls nor damages the adherend 5.

In the case where the substrate 1 of the pressure-sensitive adhesive sheet is a stretchable substrate, a stretching treatment can be conducted, for example, by using a stretching means ordinarily used for two-dimensionally stretching sheets.

Since the radiation-curable heat-peelable pressure-sensitive adhesive sheet of the invention has the pressure-sensitive adhesive layer 2 containing a pressure-sensitive adhesive substance (pressure-sensitive adhesive), the adherend 5 can be tenaciously held thereon by tackiness, so that the adherend 5 does not separate from the pressure-sensitive adhesive sheet even when the sheet vibrates during transportation. Furthermore, since the pressure-sensitive adhesive layer 2 is moderately cured by irradiation with a radiation before a cutting step, the adherend can be cut into a given size in the cutting step while preventing the pressure-sensitive adhesive layer from being flung up by the cutting blade and while preventing the pressure-sensitive adhesive from deforming to cause chipping etc. Moreover, since the pressure-sensitive adhesive layer 2 contains heat-expandable microspheres and has thermal expansibility, the heat-expandable microspheres are promptly foamed or expanded by a heat treatment after the cutting step and the pressure-sensitive adhesive layer thus changes in volume to form a three-dimensional structure with a rough surface. Consequently, the area in which the adhesive layer is adherent to the resultant cut pieces 8 decreases considerably, and the adhesive strength hence is considerably reduced or lost. Thus, a considerable decrease or elimination of adhesive strength is attained through the curing of the pressure-sensitive adhesive layer by irradiation with a radiation and through the heat treatment. As a result, the operating efficiency and working efficiency in the step of cutting the adherend 5 and in the step of separating and recovering the cut pieces 8 are greatly improved, and the production efficiency also can be greatly improved.

Although the radiation-curable heat-peelable pressure-sensitive adhesive sheet of the invention may be used in applications in which an adherend is permanently bonded, it is suitable for use in applications in which an adherend is bonded for a given period and, after accomplishment of the purpose of bonding, the bonded state is required or desired to be ended. Besides materials for fixing semiconductor wafers or multilayered ceramic sheets, examples of such applications include carrier tapes, temporarily fixing materials, or fixing materials for, e.g., conveying or temporarily fixing parts in steps for assembling various electrical apparatus, electronic apparatus, displays, and the like and surface protective materials, masking materials, or the like used for preventing metal plates, plastic plates, glass plates, or the like from being fouled or damaged. The adhesive sheet is especially agent, 12 parts by weight of a hexafunctional photopolymerizable compound, and 3 parts by weight of a photopolymerization initiator to prepare a liquid mixture. This liquid mixture was applied to the corona-treated side of a polyester film having a thickness of 100 μm, and the coating was dried to form an acrylic pressure-sensitive adhesive layer having a thickness of 45 μm. Thus, a radiation-curable heat-peelable pressure-sensitive adhesive sheet was obtained.

COMPARATIVE EXAMPLE 1

The same procedure as in Example 1 was conducted, except that the photopolymerizable compound and the photopolymerization initiator were omitted. Thus, a heat-peelable pressure-sensitive adhesive sheet was obtained.

COMPARATIVE EXAMPLE 2

The same procedure as in Example 1 was conducted, except that the heat-expandable microspheres were omitted. Thus, a radiation-curable pressure-sensitive adhesive sheet was obtained.

EVALUATION TEST

A polyester film having a thickness of 25 μm (trade name "Lumilar S10", manufactured by Toray Industries, Inc.) was press-bonded to the pressure-sensitive adhesive layer side of each of the pressure-sensitive adhesive sheets (20 mm wide) obtained in the Example and Comparative Examples. These test pieces were examined for 180° peel tackiness (N/20 mm; peel rate, 300 mm/min; 23° C.). This tackiness measurement was made before treatments, after irradiation with a radiation, and after the irradiation and a subsequent heat treatment. The irradiation with a radiation was conducted by using an air-cooled high-pressure mercury lamp (46 mJ/min) to irradiate each test piece from the pressure-sensitive adhesive sheet side with ultraviolet for 10 seconds. The heat treatment was conducted in a 130° C. hot-air drying oven for 5 minutes.

Furthermore, each of the pressure-sensitive adhesive sheets obtained in the Example and Comparative Examples was applied to a semiconductor wafer having a thickness of 50 μm and then irradiated with a radiation. Subsequently, the wafer was diced with a dicer (DFD651, manufactured by DISCO), and whether or not an adhesive waste was flung up was visually examined. Thereafter, a heat treatment was conducted, and the cut pieces were picked up and visually examined for the occurrence of cracking caused by the pickup. The irradiation with a radiation and the heat treatment were conducted under the same conditions as in the above evaluation.

The results of the evaluations are shown in the Table below. In each of the Example and Comparative Examples, no adhesive residue was visually observed on the polyester film and chips separated from the pressure-sensitive adhesive sheet after the heat treatment.

TABLE

| | Example 1 | Comparative Example 1 | Comparative Example 2 |
|---|---|---|---|
| Tackiness (N/20 mm) | | | |
| Before treatments | 2.50 | 2.60 | 2.40 |
| After irradiation | 0.50 | 2.20 | 0.60 |
| After irradiation and heating | 0.00 | 0.05 | 0.70 |
| Adhesive flinging | Not occurred | Occurred | Not occurred |
| Chip cracking | Not occurred | Not occurred | Occurred |

The Table shows the following. In the pressure-sensitive adhesive sheet obtained in Example 1, the tackiness of the pressure-sensitive adhesive layer moderately decreased upon the irradiation with a radiation, whereby the pressure-sensitive adhesive could be prevented from being flung up during the cutting. Furthermore, the tackiness was lost by the subsequent heat treatment, whereby the chips could be prevented from cracking during the pickup. In contrast, the pressure-sensitive adhesive sheet of Comparative Example 1 underwent little decrease in tackiness upon the irradiation with a radiation, so that the pressure-sensitive adhesive was flung up during the cutting. The pressure-sensitive adhesive sheet of Comparative Example 2 underwent a decrease in tackiness upon the irradiation with a radiation but underwent no further decrease in tackiness upon the subsequent heating, so that the chips cracked during the chip pickup.

What is claimed is:

1. A process for producing cut pieces which comprises placing a work to be cut on the surface of the pressure-sensitive adhesive layer of a radiation-curable, heat-peelable pressure-sensitive adhesive sheet which comprises a substrate and, formed on at least one side thereof, a pressure-sensitive adhesive layer containing heat-expandable microspheres and a radiation-curable compound, irradiating the pressure-sensitive adhesive layer with a radiation to cure the adhesive layer, cutting the work into pieces, subsequently thermally foaming the pressure-sensitive adhesive layer, and then separating and recovering the cut pieces from the adhesive sheet.

2. The process for producing cut pieces as claimed in claim 1, wherein said pressure-sensitive adhesive is selected from the group consisting of rubber-based pressure-sensitive adhesives, silicone-based pressure-sensitive adhesives and acrylic pressure-sensitive adhesives.

3. The process for producing cut pieces as claimed in claim 1, wherein said heat-expandable microspheres have an average particle diameter of about 1 to 80 μm.

4. The process for producing cut pieces as claimed in claim 1, wherein said heat-expandable microspheres are contained in an amount of 10 to 200 parts by weight per 100 parts by weight of a base polymer constituting the radiation-curable, heat-expandable pressure-sensitive adhesive layer.

5. The process for producing cut pieces as claimed in claim 1, wherein said radiation-polymerizable compound has a molecular weight of about 10,000 or lower.

6. The process for producing cut pieces as claimed in claim 1, wherein said radiation-polymerizable compound is contained in an amount of 1 to 100 parts by weight per 100 parts by weight of a base polymer constituting the radiation-curable, heat-expandable pressure-sensitive adhesive layer.

\* \* \* \* \*

UNITED STATES PATENT AND TRADEMARK OFFICE
CERTIFICATE OF CORRECTION

PATENT NO. : 6,488,803 B2
APPLICATION NO. : 09/782037
DATED : December 3, 2002
INVENTOR(S) : Kazuyuki Kiuchi et al.

Page 1 of 1

It is certified that error appears in the above-identified patent and that said Letters Patent is hereby corrected as shown below:

At column 11, in line 6:

After "especially", insert --suitable for use in electronic part production processes for producing small or thin parts such as semiconductor chips and multilayer capacitor chips.

According to the invention, since the pressure-sensitive adhesive layer is constituted of a combination of specific components, not only the adhesive layer has tackiness enabling adherends to withstand transportation and other steps, but also cutting can be conducted highly precisely without flinging up an adhesive waste or causing chipping and the resultant cut pieces can be easily separated and recovered from the adhesive sheet. Consequently, the operating efficiency and working efficiency in the step of separating and recovering the cut pieces can be greatly heightened; whereby the efficiency of production of small or thin cut pieces such as, e.g., semiconductor chips and multilayer capacitor chips can be greatly improved.

The invention will be explained below in more detail by reference to an Example, but the invention should not be construed as being limited to the Example in any way.

EXAMPLE 1

A hundred parts by weight of an acrylic copolymer (weight average molecular weight, 500,000) formed from 100 parts by weight of butyl acrylate and 5 parts by weight of 2-hydroxyethyl acrylate was mixed with 30 parts by weight of heat-expandable microspheres (trade name "Matsumoto Microsphere F-50D", manufactured by Matsumoto Yushi-Seiyaku Co., Ltd.), 3 parts by weight of an isocyanate crosslinking--

Signed and Sealed this
Eighteenth Day of December, 2012

David J. Kappos
*Director of the United States Patent and Trademark Office*